(12) United States Patent
Lee et al.

(10) Patent No.: US 11,697,357 B2
(45) Date of Patent: Jul. 11, 2023

(54) SYSTEM AND METHOD OF MANAGING BATTERY OF VEHICLE

(71) Applicants: Hyundai Motor Company, Seoul (KR); Kia Corporation, Seoul (KR)

(72) Inventors: Sung Il Lee, Hwaseong-si (KR); Min Su Kang, Suwon-si (KR); Ki Seung Baek, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 11 days.

(21) Appl. No.: 17/458,987

(22) Filed: Aug. 27, 2021

(65) Prior Publication Data

US 2022/0009375 A1    Jan. 13, 2022

Related U.S. Application Data

(63) Continuation-in-part of application No. 17/109,621, filed on Dec. 2, 2020, now Pat. No. 11,366,167.

(30) Foreign Application Priority Data

Jul. 8, 2020  (KR) .................. 10-2020-0084030
Nov. 3, 2020  (KR) .................. 10-2020-0145379

(51) Int. Cl.
*B60L 58/12*       (2019.01)
*G01R 31/382*      (2019.01)
(Continued)

(52) U.S. Cl.
CPC ............ *B60L 58/12* (2019.02); *G01R 31/382* (2019.01); *H01M 10/425* (2013.01); *H02J 7/0048* (2020.01); *H01M 2010/4271* (2013.01)

(58) Field of Classification Search
None
See application file for complete search history.

(56) References Cited

U.S. PATENT DOCUMENTS 5,781,013 A    7/1998   Takahashi
5,869,951 A    2/1999   Takahashi
(Continued)

FOREIGN PATENT DOCUMENTS

CN    110065394 A      7/2019
EP    2 295 282 A2     3/2011
(Continued)

OTHER PUBLICATIONS

Extended European Search Report dated Oct. 6, 2021, issued in corresponding European Patent Application No. 20211178.7.
(Continued)

*Primary Examiner* — Roy Y Yi
(74) *Attorney, Agent, or Firm* — Morgan, Lewis & Bockius LLP

(57) ABSTRACT

A battery management system of a vehicle includes a first controller configured to control a power-on (IG ON) state and a power-off (IG OFF) state of the plurality of controllers, and a second controller including a real time clock (RTC) and configured to be woken up by directly receiving power from the secondary battery in every preset time period during a preset time calculated based on a count value provided from the RTC when a power-off state is started by the first controller and to monitor states of the main battery and the secondary battery.

14 Claims, 4 Drawing Sheets

(51) Int. Cl.
*H01M 10/42* (2006.01)
*H02J 7/00* (2006.01)

(56) References Cited

U.S. PATENT DOCUMENTS

| | | | | |
|---|---|---|---|---|
| 8,704,495 | B2* | 4/2014 | Sakai | H02J 7/04 |
| | | | | 320/155 |
| 2011/0066309 | A1 | 3/2011 | Matsuoka et al. | |
| 2012/0072144 | A1 | 3/2012 | Zhang et al. | |
| 2013/0207592 | A1 | 8/2013 | Okada | |
| 2014/0159670 | A1 | 6/2014 | Lee et al. | |
| 2014/0266062 | A1 | 9/2014 | Lee | |
| 2016/0207415 | A1 | 7/2016 | Sato et al. | |
| 2017/0361791 | A1 | 12/2017 | Yoon et al. | |
| 2018/0115178 | A1 | 4/2018 | Moon et al. | |
| 2018/0260019 | A1 | 9/2018 | Kim et al. | |
| 2020/0180464 | A1 | 6/2020 | Jang et al. | |
| 2020/0185943 | A1 | 6/2020 | Youn et al. | |
| 2020/0233450 | A1 | 7/2020 | Giri et al. | |

FOREIGN PATENT DOCUMENTS

| | | |
|---|---|---|
| JP | 8-126104 A | 5/1996 |
| JP | 2003-063330 A | 3/2003 |
| JP | 2007-230398 A | 9/2007 |
| KR | 10-2010-0085791 A | 7/2010 |
| KR | 10-2013-0061964 A | 6/2013 |
| KR | 10-1477272 B1 | 1/2015 |
| KR | 10-2018-0056091 A | 5/2018 |

OTHER PUBLICATIONS

Extended European Search Report dated May 28, 2021 issued in European Patent Application No. 20211495.

Song et al. ("Dynamic SOC Compensation of an Ultracapacitor Module for a Hybrid Energy Storage System" (2009) Journal of Power Electronics, p. 769-776) (Year: 2009).

U.S. Office Action dated Dec. 8, 2021, issued in corresponding U.S. Appl. No. 17/109,621.

* cited by examiner

SYSTEM AND METHOD OF MANAGING BATTERY OF VEHICLE

CROSS REFERENCE TO RELATED APPLICATIONS

The present application claims priority to Korean Patent Application No. 10-2020-0145379, filed Nov. 3, 2020. The present application is a continuation-in-part application of U.S. patent application Ser. No. 17/109,621, filed Dec. 2, 2020, which claims priority to Korean Patent Application No. 10-2020-0084030, filed Jul. 8, 2020. The entire contents of Korean Patent Application Nos. 10-2020-0145379 and 10-2020-0084030 and U.S. patent application Ser. No. 17/109,621 are incorporated herein for all purposes by this reference.

TECHNICAL FIELD

The present disclosure relates to a system and method of managing a battery of a vehicle, and more particularly, to a system and method of managing a battery of a vehicle for preventing various problems, which occur in the battery in a power-off state, in advance by effectively monitoring the state of the battery by various controllers in a vehicle in a power-off state after the vehicle stops traveling.

BACKGROUND

In general, an eco-friendly vehicle driven using electric energy produces power by driving a motor that is an electrically rotating device using electric energy stored in a battery. The dynamic performance of the eco-friendly vehicle is very closely related to battery performance, and thus it is necessary to efficiently monitor and manage a battery.

In general, a battery of an eco-friendly vehicle is managed by controllers that are collectively referred to as a battery management system (BMS). The BMS collects various pieces of information (a battery voltage, a battery current, or a battery temperature) for management of a battery from the battery and calculates various parameters for management of the battery by applying the collected information to various pre-stored algorithms.

A conventional vehicle battery management scheme is mainly performed in the state in which power is supplied to controllers called a battery management system (BMS), that is, a power-on (IG ON) state or the state (IG3 ON) in which power is supplied to controllers related to a battery.

In the conventional vehicle battery management scheme, a main relay connected to the battery through IG ON monitors the battery in the state in which electrical connection between the battery and other components (e.g., a power module for converting power of a battery and supplying the converted power to a motor or a charger for generating power for charging the battery) is formed or the state in which electric power is supplied to various controllers related to the battery through IG3 ON.

Accordingly, in the conventional vehicle battery management scheme, since information for management of a battery is collected in the state in which electrical connection between the battery and other components is achieved, there is a problem in that the state of the battery is not accurately monitored due to influence of the other components on the collected information or electric power is supplied to other controllers that do not need to be operated while the battery is monitored thus incurring unnecessary power loss.

The contents described as the related art have been provided only to assist in understanding the background of the present disclosure and should not be considered as corresponding to the related art known to those having ordinary skill in the art.

SUMMARY

An object of the present disclosure is to provide a system and method of managing a battery of a vehicle for preventing accidents such as combustion of a battery in advance by efficiently monitoring the battery without waste of power in the state in which a vehicle is powered off.

According to an embodiment of the present disclosure, a battery management system of a vehicle including a main battery for storing driving power of the vehicle and a secondary battery having a lower voltage output than the main battery and for storing electric power for a plurality of controllers in the vehicle includes a first controller configured to control a power-on (IG ON) state and a power-off (IG OFF) state of the plurality of controllers, and a second controller including a real time clock (RTC) and configured to be woken up by directly receiving power from the secondary battery in every preset time period during a preset time calculated based on a count value provided from the RTC when a power-off state is started by the first controller, and to monitor states of the main battery and the secondary battery.

The second controller may be configured not to monitor the states of the main battery and the secondary battery after a reference time elapses.

The second controller may be configured to operate in a power latch mode that is executed by directly receiving power from the secondary battery during a preset reference time when a power-off state is started by the first controller, and to be woken up in every preset time period after the power latch mode is terminated.

The second controller may be configured to turn off a main relay for connecting/interrupting output of the main battery when the power-off state is started by the first controller, and to check a condition in which the states of the main battery and the secondary battery are not monitored.

As the condition, when it is impossible to check a state of charge (SoC) of the second battery for supplying a power voltage of the first controller and the second controller, when an SoC of the first battery is lower than a preset reference, when it is impossible to communicate with the first controller or a low voltage DC-DC converter for dropping a voltage of the first battery and applying the dropped voltage to the second battery, or when the low voltage DC-DC converter malfunctions, the second controller may be configured not to monitor the states of the main battery and the secondary battery.

After woken up, the second controller may be configured to check whether a main relay connected to the first battery short circuits, and to initiate the preset time calculated based on the count value provided by the RTC in advance when a state in which the main relay short circuits is changed to the power-off state.

When an SoC of the second battery is equal to or less than a preset reference value as a monitoring result of the states of the main battery and the secondary battery, after woken up, the second controller may be configured to turn on a main relay connected to the first battery and may operate a low voltage DC-DC converter, for dropping a voltage of the first battery and applying the dropped voltage to the second battery, to charge the second battery by dropping the voltage of the first battery and applying the dropped voltage to the second battery.

When charging of the second battery is terminated, the second controller may be configured to turn off the main relay and to continuously maintain the preset time that is calculated based on the count value provided by the RTC in advance rather than resetting the preset time.

The preset time may be determined based on an analysis result of a vehicle customer relation management (VCRM) system for collecting and analyzing information on driving of the vehicle or a preset limit on a state of charge (SoC) of the second battery consumed by dark current after the vehicle stops traveling.

According to another embodiment of the present disclosure, a battery management method of a vehicle includes, when an external input of stopping driving of the vehicle is generated, controlling a plurality of controllers in the vehicle in a power-off state, by a first controller, executing a power latch mode and turning off a main relay connected to a first battery for storing energy for generating power of the vehicle, by a second controller, and terminating the power latch mode, being woken up by directly receiving power from the secondary battery in every preset time period during a preset time calculated based on a count value provided from a real time clock (RTC) installed in the second controller, and monitoring states of the main battery and the secondary battery, by the second controller.

The method may further include, after turning off the main relay, checking a condition in which the states of the main battery and the secondary battery are not monitored, and non-monitoring the states of the main battery and the secondary battery when the condition is satisfied.

The non-monitoring may include non-monitoring the states of the main battery and the secondary battery by the second controller, as the condition, when it is impossible to check a state of charge (SoC) of the second battery for supplying a power voltage of the first controller and the second controller, when an SoC of the first battery is lower than a preset reference, when it is impossible to communicate with the first controller or a low voltage DC-DC converter for dropping a voltage of the first battery and applying the dropped voltage to the second battery, or when the low voltage DC-DC converter malfunctions.

The monitoring may include, after woken up, checking whether a main relay connected to the first battery short circuits, by the second controller, and initiating a preset time that is calculated based on a count value provided by the RTC in advance when a state in which the main relay short circuits is changed to the power-off state, by the second controller.

The monitoring may include, when an SoC of the second battery is equal to or less than a preset reference value as a monitoring result of the states of the main battery and the secondary battery, after woken up, turning on a main relay connected to the first battery and operating a low voltage DC-DC converter, for dropping a voltage of the first battery and applying the dropped voltage to the second battery, to charge the second battery by dropping the voltage of the first battery and applying the dropped voltage to the second battery, by the second controller.

The monitoring may include, when charging of the second battery is terminated, turning off the main relay and continuously maintaining the preset time that is calculated based on the count value provided by the RTC in advance rather than resetting the preset time.

DETAILED DESCRIPTION

Hereinafter, a system and method of managing a battery of a vehicle according to exemplary embodiments of the present disclosure will be described in detail with reference to the attached drawings.

Figure 1:
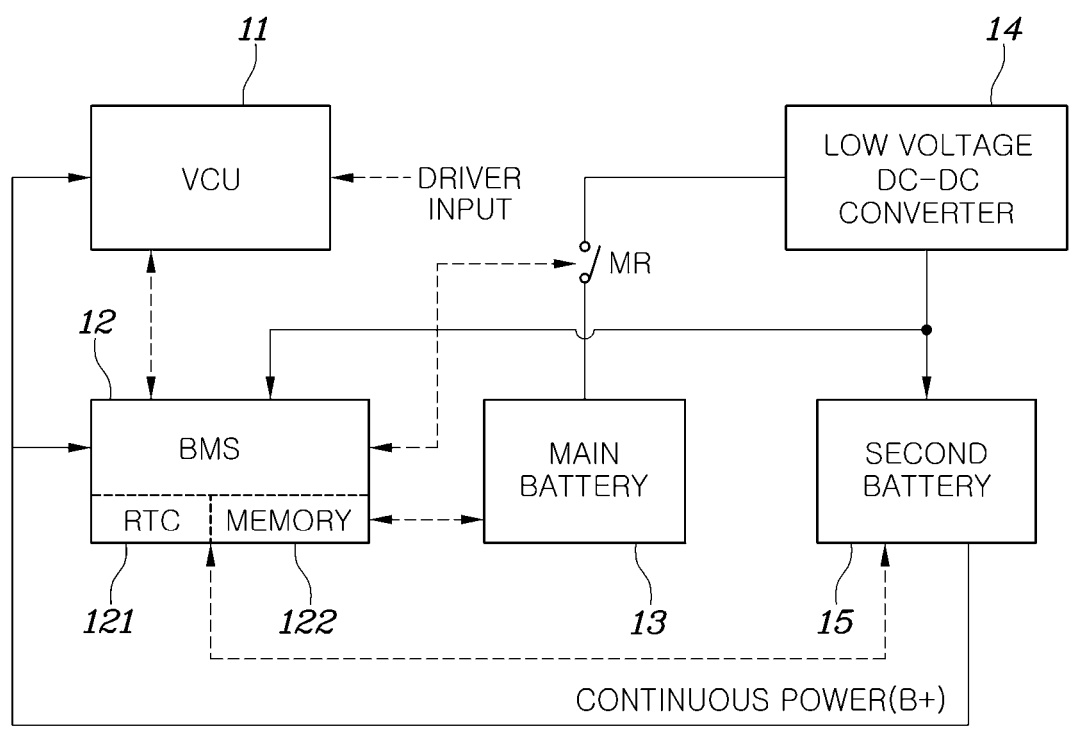
FIG. 1 is a block diagram showing the configuration of a vehicle battery management system according to an embodiment of the present disclosure.

FIG. 1 is a block diagram showing the configuration of a vehicle battery management system according to an embodiment of the present disclosure.

Referring to FIG. 1, the vehicle battery management system according to an embodiment of the present disclosure may include a main battery 13 for storing driving power of a vehicle and a secondary battery 15 having a lower voltage output than the main battery 13 and for storing electric power for a plurality of controllers in the vehicle. The vehicle battery management system according to an embodiment of the present disclosure may further include a first controller 11 for controlling a power-on (IG ON) state and a power-off (IG OFF) state of the plurality of controllers, and a second controller 12 that has a real time clock (RTC) 121, is woken up by directly receiving power from the secondary battery 15 in every preset time period based on a count value provided from the RTC 121 when a power-off state is started by the first controller 11, and monitors the states of the main battery 13 and the secondary battery 15.

As shown in FIG. 1, the first controller 11 may be embodied as a vehicle control unit (VCU) for controlling the overall operation of the vehicle, and the second controller may be embodied as a controller known as a battery management system (BMS) that mainly monitors the state of the battery and controls the state of a main relay (MR) connected to the battery, or the like, but the present disclosure is not limited thereto. For example, the second controller 12 may be embodied as a hybrid control unit (HCU), a low voltage DC-DC converter (LDC) controller, or the like, which is other controllers included in the vehicle including a motor driven using energy stored in the battery.

The first battery 13 may be a main battery (or a high-voltage battery) of the vehicle that is charged by supplying energy to a driving motor for generating power of the vehicle or receiving energy regeneration of the driving motor.

The second battery 15 may be a battery for supplying a power voltage to various controllers including the first and second controllers in the vehicle and an electrical load and may be a battery having a lower voltage output than the first battery 13.

A low voltage DC-DC converter (LDC) for dropping a high voltage of the first battery 13 to a voltage of the second battery 15 or a voltage corresponding to power of a controller or an electrical load in the vehicle may be disposed between the first battery 13 and the second battery 15. The second controller 12 may control a low voltage DC-DC converter 14 and may charge the second battery 15 by dropping the voltage of the first battery 13 and providing the dropped voltage to the second battery 15.

According to an embodiment of the present disclosure, the first controller 11 may control a power-on (IG ON) state or a power-off (IG OFF) state for a plurality of controllers in the vehicle based on a signal input from the outside (e.g., a start button). For example, in a power-off state, when a driver generates an input of pushing a start button of the vehicle, the first controller 11 may recognize the input and may supply power to a plurality of other controllers in the vehicle to change the current state to a power-on (IG ON) state. On the other hand, in a power-on state, when the driver generates an input of pushing the start button of the vehicle, the first controller 11 may recognize the input and may interrupt supply of power to a plurality of other controllers in the vehicle to change the current state to a power-off (IG OFF) state.

The second controller 12 may be operated according to power-on or power-off state control performed by the first controller 11, and immediately after the power-on state is changed to the power-off state as the vehicle stops traveling according to input of the driver, the second controller 12 may turn off the main relay (MR) while maintaining the power-on state for a predetermined time using a power latch function installed therein. Here, the main relay (MR) may be a relay for connecting or interrupting output of the first battery 13 to or from a vehicle system, and when the main relay (MR) is turned off and becomes in an open state, all systems in the vehicle may become in the state in which power is not capable of being received from the main relay (MR).

A power latch function or a power latch mode may be a function of maintaining the state in which power is supplied for a predetermined time using a power line connected directly to the second battery 15, which supplies power as necessary, by the second controller 12 even if the first controller 11 performs power-off (IF OFF) control. That is, the second controller 12 may achieve electrical connection with the second battery 15 to directly receive power therefrom irrespective of a power line (e.g., an IG line) controlled by the first controller 11. In general, power that is directly connected to the second battery 15 may also be referred to as continuous power. According to an embodiment of the present disclosure, the first controller 11 and the second controller may be connected to continuous power, and may be continuously operated using a wake-up function that is executed for a predetermined time in every period in order to prevent the second battery 15 from being discharged using continuous power.

The second controller 12 may mainly measure an insulation resistance value of the first battery 13 and may monitor a voltage deviation between battery cells included in the first battery 13, a deterioration degree of the first battery 13, a voltage of the second battery 15, or the like in order to check a problem that occurs in the first battery 13 and the second battery 15 after the vehicle stops traveling and is powered off.

The insulation resistance of the battery, the voltage deviation between battery cells, and the deterioration degree may be derived or calculated using some of various schemes known in the art, and the detailed scheme of deriving or calculating the insulation resistance of the battery, the voltage deviation between battery cells, and the deterioration degree is not directly related to the spirit of the present disclosure, and accordingly, a detailed description thereof is omitted.

The second controller 12 may be autonomously woken up in every preset time period using a real time clock (RTC) 121 installed therein after a power-off (IG OFF) state of the vehicle is started according to control of the first controller 11 and may monitor the first battery 13 and the second battery 15.

Figure 2:
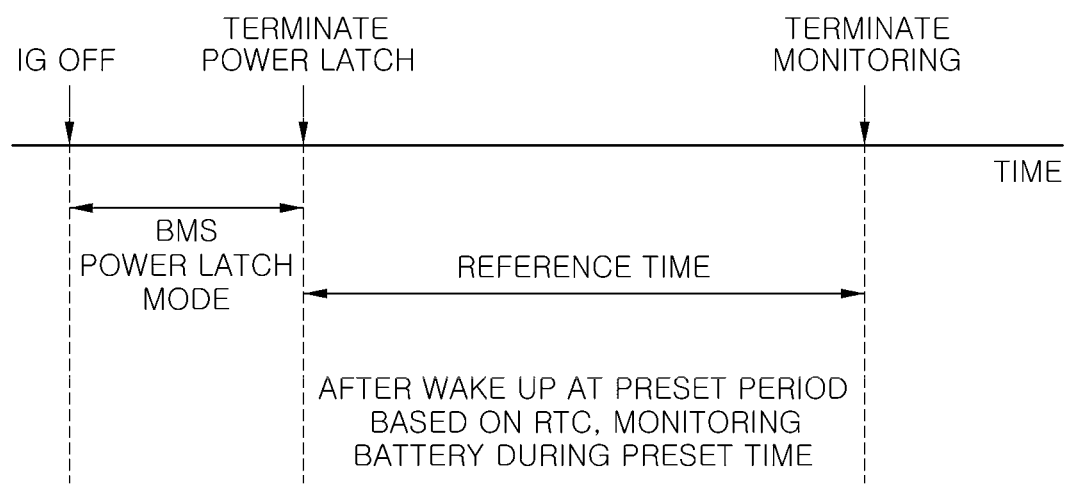
FIG. 2 is a diagram showing a monitoring procedure by a vehicle battery management system over time according to an embodiment of the present disclosure.

FIG. 2 is a diagram showing a monitoring procedure by a vehicle battery management system over time according to an embodiment of the present disclosure.

When a driver input of stopping driving of the vehicle (a start button input in a power-on state) is generated, the first controller 11 may start a power-off (IG OFF) state of powering off a plurality of controllers in the vehicle. As such, when a power-on (IG ON) state is converted into a power-off (IG OFF) state, the power-off (IG OFF) state may be started, and simultaneously the second controller 12 may execute the power latch mode. A reference time when the power latch mode is maintained may be preset to about several hours.

When the power latch mode is terminated, the second controller 12 may be powered off, may be woken up in every preset time interval for the preset reference time, and may monitor the first battery 13 and the second battery 15 for a preset time.

For example, the referenced time for monitoring a battery by a power-off and wake-up operation of the second controller 12 may be about several days. According to analysis of a vehicle customer relation management (VCRM) system for collecting and analyzing various pieces of information of driving of the vehicle, most drivers turn on a vehicle again within at least seven days after the vehicle stops traveling. In addition, a state of charge (SoC) of the second battery 15 consumed by dark current after the vehicle stops traveling may be limited by each vehicle manufacturer. The reference time for monitoring the battery by the power-off and wake-up operation of the second controller 12 may be appropriately determined according to the analysis result of the VCRM system or specifications of managing dark current of the secondary battery applied to the vehicle.

The second controller 12 may accumulate the number of times the second controller 12 is woken up in every time period, may check a reference time for monitoring the battery, and may stop monitoring when the reference time elapses.

A time interval at which the second controller 12 is woken up may be appropriately determined depending on the lifespan of a memory 122 included in the second controller 12. For example, the number of times writing of an EEPROM employed as the memory is capable of being performed may be guaranteed to a specific number of times or less. A wake-up time interval may be determined in such a way that the maximum writing number of times of the EEPROM is not greater than the guaranteed writing number of times during an expected lifespan of the vehicle in consideration of the guaranteed writing number of times of the EEPROM and the maximum number of times the EEPROM performs writing while the second controller 12 is woken up.

In addition, the time for monitoring the first battery 13 and the second battery 15 after the second controller 12 is woken up may be appropriately determined with reference to the number of times monitoring items are performed on each battery (e.g., measurement of insulation resistance) or the time for performing the monitoring items.

According to various embodiments of the present disclosure, in the state in which the vehicle is powered off (IG OFF) and the first battery 13 is not connected to a vehicle system, that is, in the state in which the main relay (MR) is turned off (short circuiting), the first battery 13 may be monitored. Thus, when the state in which the first battery 13 is not connected to the vehicle system is maintained, the aforementioned monitoring may be performed. During the aforementioned monitoring procedure, when an electrical connection state of the first battery 13 is changed, that is, when the main relay (MR) is turned on (closed), battery monitoring according to various embodiments of the present disclosure may be stopped and the monitoring procedure may be initiated, and when the main relay (MR) is turned off again, battery monitoring may be started again from an initial procedure (i.e., a power latch mode of the second controller 12 is performed) for the battery monitoring.

According to various embodiments of the present disclosure, when an SoC of the second battery 15 is lower than a preset reference value, the second controller 12 may charge by turning on the main relay (MR), driving the low voltage DC-DC converter 14, dropping a voltage of the first battery 13, and providing the dropped voltage to the second battery 15. In this case, even if the main relay (MR) is turned on, the monitoring procedure may not be initiated. This is because, when the monitoring procedure is initiated if the SoC of the second battery 15 is low and the main relay is turned on, charging of the second battery 15 and a new monitoring procedure are continuously repeated and are not capable of being terminated within a preset time.

When a driver pushes a vehicle start button to generate an input for powering off the vehicle after the vehicle stops traveling and the first controller 11 controls controllers of the vehicle in the power-off (IG OFF) state, the second controller 12 may turn off the main relay (MR) while maintaining power using a power latch function and may then determine whether requirements for monitoring the first battery 13 are satisfied.

Here, as the requirements for monitoring the first battery 13, whether a state of charge (SoC) of the second battery 15 is calculated, an SoC of the first battery 13, a communication state between controllers, or the like may be considered.

For example, when the second controller 12 is not capable of checking the SoC of the second battery 15 for supplying power to the controllers 11 and 12, the first controller 11 and the second controller 12 may not be capable of checking whether it is possible to supply sufficient power for monitoring of the first battery 13 in the state in which the second battery 15 is not charged, and thus monitoring of the first battery 13 may not be performed.

When the SoC of the second battery 15 is lower than a preset reference, the low voltage DC-DC converter 14 may be operated to charge the second battery 15 with energy stored in the first battery 13 and to perform battery monitoring, and when the SoC of the first battery 13 is not sufficient, if the second battery 15 is charged, the SoC of the first battery 13 may be lowered and it may not be possible to drive the vehicle. Thus, when the SoC of the first battery 13 is lower than a preset reference, monitoring may not be performed.

When communication between the first controller 11 and the second controller 12 or communication between the second controller 12 and the low voltage DC-DC converter 14 (e.g., CAN communication) is impossible (e.g., CAN timeout), it may not be possible to exchange various pieces of data required to perform monitoring, and thus monitoring may not be performed.

When the low voltage DC-DC converter 14 is determined to malfunction (e.g., an error code of the low voltage DC-DC converter 14 is generated), it is impossible to charge the second battery 15, and thus monitoring may not be performed.

Figure 3:
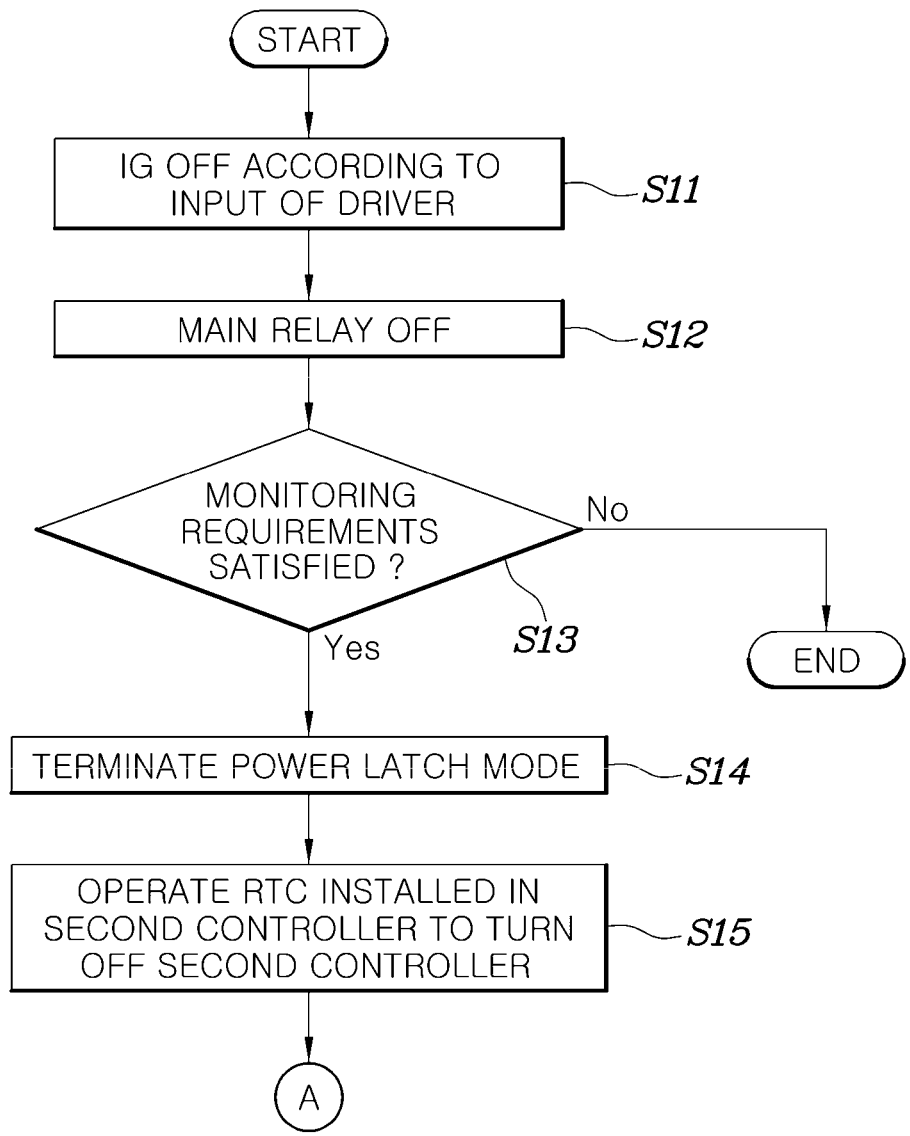
FIGS. 3 and 4 are flowcharts showing a vehicle battery management method according to an embodiment of the present disclosure.
Figure 4:
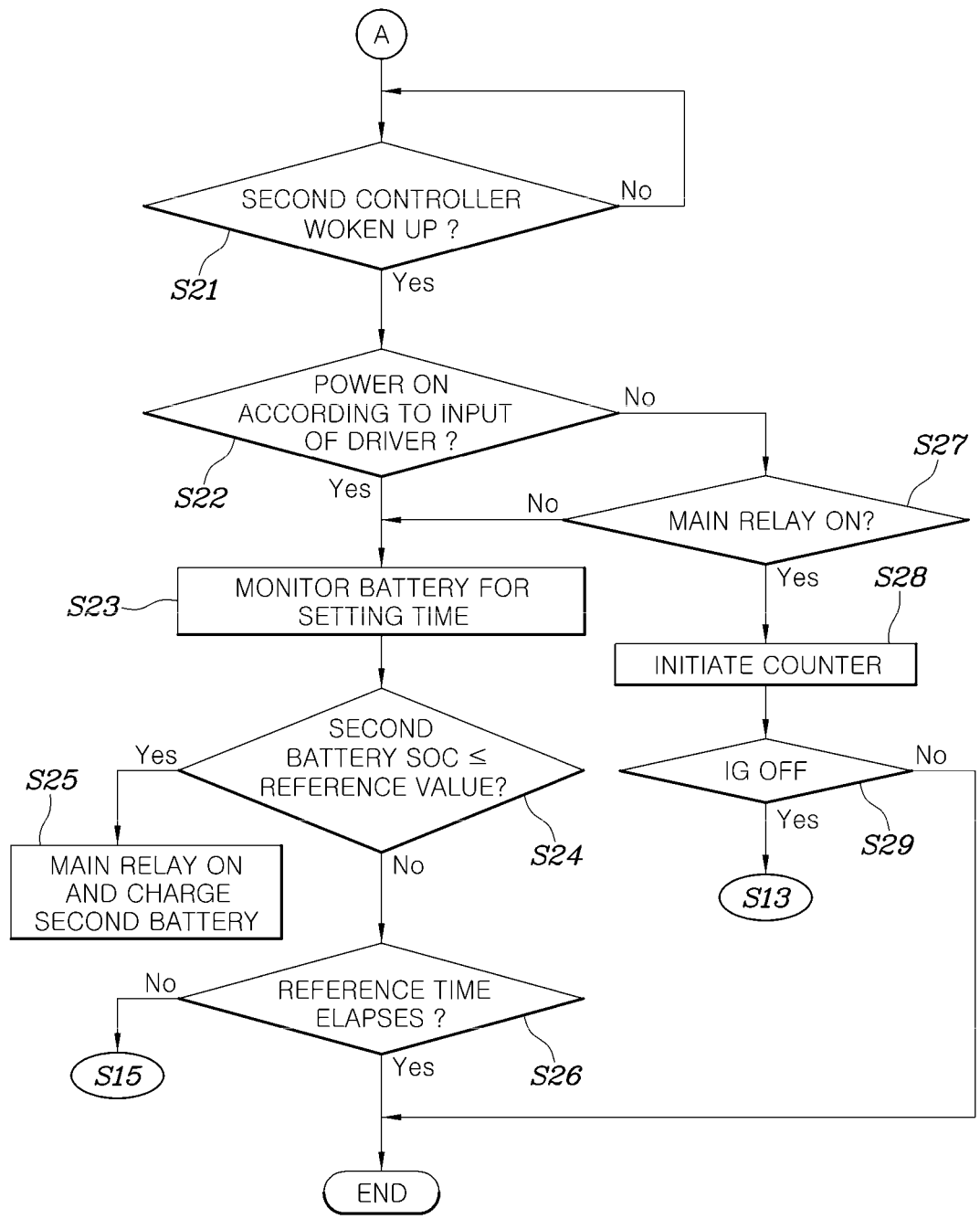

FIGS. 3 and 4 are flowcharts showing a vehicle battery management method according to an embodiment of the present disclosure. The vehicle battery management method according to an embodiment of the present disclosure may be performed by the aforementioned vehicle battery management system according to an embodiment of the present disclosure.

Referring to FIGS. 3 and 4, when a driver generates an input of stopping driving of the vehicle in the state in which the vehicle is parked, the method may be performed from operation S11 of powering off controllers in the vehicle by the first controller 11.

When the controllers become in the power-off (IG OFF) state by the first controller 11, the second controller 12 may turn off the main relay (MR) while maintaining power using a power latch function (S12) and may check whether requirements for performing monitoring is satisfied in the state in which the main relay (MR) is turned off (S13).

In operation S13, when it is impossible to check the SoC of the second battery 15 for providing a power voltage of the first controller 11 and the second controller 12, the SoC of the first battery 13 is lower than a preset reference, the low voltage DC-DC converter 14, for dropping a voltage of the first battery 13 and applying the dropped voltage to the second battery 15, malfunctions, or it is impossible to communicate with the low voltage DC-DC converter 14 or the first controller 11, the second controller 12 may determine that monitoring is not performed.

When the requirements for performing monitoring are satisfied in operation S13, the power latch mode may be terminated (S14) and the second controller 12 may operate the RTC 121 installed therein and then may be shut down (S15).

Then, the second controller 12 may be woken up using continuous power based on a count value of the RTC 121 (S21). The wake-up performed in operation S21 is based on the count value of the RTC installed in the second controller 12, only the second controller 12 may be woken up, and the first controller 11 may not be woken up. Accordingly, supply of power may be interrupted to other controllers or an electrical load by wake-up of the first controller 11, thereby reducing power consumption generated after the vehicle stops traveling.

Then, the woken-up second controller 12 may determine whether the second controller 12 is woken up according to input of the driver or the second controller 12 is woken up by powering on the vehicle by the woken-up first controller 11 (S22).

When the second controller 12 is woken up in order to perform battery monitoring based on the count of the RTC 121 installed therein, the second controller 12 may monitor the first battery 13 and the second battery 15 for a preset time (S23).

As the monitoring result, when an SoC of the second battery 15 is equal to or less than a preset reference value (S24), the second controller 12 may turn on the main relay (MR) and may operate the low voltage DC-DC converter 14 to charge the second battery 15 to have a greater SoC value than the preset reference value.

When the SoC of the second battery 15 is greater than the reference value in operation S24, or after the second battery 15 is charged in operation S25, the second controller 12 may check whether a preset reference time for performing monitoring elapses, and then the second controller 12 may be powered off until next monitoring is performed when the reference time does not elapse and may terminate a monitoring procedure when the reference time elapses (S26).

When the second controller 12 is woken up and is powered on (S21) and it is determined that the reason for becoming the power-on state is a power-on (IG ON) state under control of the first controller 11 according to input of a driver (S22), the second controller 12 may determine whether the main relay (MR) needs to be turned on, and when the main relay (MR) is turned on (S27), a counter may be initiated (S28). That is, the state of the battery may be changed while the first controller 11 is connected to the vehicle system by turning on the main relay (MR), and monitoring of the battery, which is previously performed, may be terminated.

After the counter is initiated (S28), when the vehicle becomes in the power-off (IG OFF) state again by the first controller 11, the method may proceed to operation S12 to perform the aforementioned monitoring procedure again from the beginning. After the counter is initiated (S28), the vehicle may start traveling rather than becoming in the power-off (IG OFF) state again by the first controller 11, the monitoring procedure may be terminated.

As described above, in the system and method of managing a battery of a vehicle according to various embodiments of the present disclosure, the state of the battery may be monitored by periodically waking up only a controller for managing the vehicle battery system based on an RTC installed therein in the state in which the vehicle stops traveling, and thus other controllers that are not related to a battery system may be prevented from being woken up while monitoring the battery, thereby reducing power consumption due to battery monitoring in the state in which the vehicle stops traveling.

In particular, in the system and method of managing a battery of a vehicle according to various embodiments of the present disclosure, the number of times battery monitoring is performed may be appropriately determined as a time elapses after a power-off state is started, and thus the state of the battery may be efficiently monitored while minimizing power consumption in the power-off state.

In the system and method of managing a battery of a vehicle, the state of the battery may be monitored by periodically waking up only a controller for managing the vehicle battery system based on an RTC installed therein in the state in which the vehicle stops traveling, and thus other controllers that are not related to a battery system may be prevented from being woken up while monitoring the battery, thereby reducing power consumption due to battery monitoring in the state in which the vehicle stops traveling.

In particular, in the system and method of managing a battery of a vehicle, the number of times battery monitoring is performed may be appropriately determined as a time elapses after a power-off state is started, and thus the state of the battery may be efficiently monitored while minimizing power consumption in the power-off state.

The first controller 11 may include a processor or a microprocessor. In addition, the first controller 11 may also include a memory. The aforementioned operations/functions of the first controller 11 can be embodied as computer readable code/algorithm/software stored on the memory thereof which may include a non-transitory computer readable recording medium. The non-transitory computer readable recording medium is any data storage device that can store data which can thereafter be read by the processor or the microprocessor. Examples of the computer readable recording medium include a hard disk drive (HDD), a solid state drive (SSD), a silicon disc drive (SDD), read-only memory (ROM), random-access memory (RAM), CD-ROM, magnetic tapes, floppy disks, optical data storage devices, etc. The processor or the microprocessor may perform the above described operations/functions of the first controller 11, by executing the computer readable code/algorithm/software stored on the non-transitory computer readable recording medium.

Similarly, the second controller 12 may include a processor or a microprocessor. In addition, the second controller 12 may also include a memory. The aforementioned operations/functions of the second controller 12 can be embodied as computer readable code/algorithm/software stored on the memory thereof which may include a non-transitory computer readable recording medium. The processor or the microprocessor may perform the above described operations/functions of the second controller 12, by executing the computer readable code/algorithm/software stored on the non-transitory computer readable recording medium.

It will be appreciated by those skilled in the art that the effects achievable through the present disclosure are not limited to those that have been particularly described hereinabove and that other unmentioned effects of the present disclosure will be more clearly understood from the above detailed description.

Although the present disclosure has been shown and described with respect to specific embodiments, it will be apparent to those having ordinary skill in the art that the present disclosure may be variously modified and altered without departing from the spirit and scope of the present disclosure as defined by the following claims.

What is claimed is:

1. A battery management system of a vehicle including a main battery for storing driving power of the vehicle and a secondary battery having a lower voltage output than the main battery and for storing electric power for a plurality of controllers in the vehicle, the battery management system comprising:
   a first controller configured to control a power-on (IG ON) state and a power-off (IG OFF) state of the plurality of controllers; and
   a second controller including a real time clock (RTC), and configured to be woken up by directly receiving power from the secondary battery in every preset time period during a preset time calculated based on a count value provided from the RTC when the power-off state is started by the first controller and to monitor states of the main battery and the secondary battery,
   wherein, when a state of charge (SoC) of the second battery is equal to or less than a preset reference value as a monitoring result of the states of the main battery and the secondary battery, after woken up, the second controller is configured to turn on a main relay connected to the first battery and to operate a low voltage DC-DC converter, for dropping a voltage of the first battery and applying the dropped voltage to the second battery, to charge the second battery by dropping the voltage of the first battery and applying the dropped voltage to the second battery.

2. The battery management system of claim 1, wherein the second controller is configured not to monitor the states of the main battery and the secondary battery after a reference time elapses.

3. The battery management system of claim 1, wherein the second controller is configured to operate in a power latch mode that is executed by directly receiving power from the secondary battery during a preset reference time when the power-off state is started by the first controller, and to be woken up in every preset time period after the power latch mode is terminated.

4. The battery management system of claim 1, wherein the second controller is configured to turn off the main relay for connecting/interrupting output of the main battery when the power-off state is started by the first controller, and to check a condition in which the states of the main battery and the secondary battery are not monitored.

5. The battery management system of claim 4, wherein, as the condition, when it is impossible to check the SoC of the second battery for supplying a power voltage of the first controller and the second controller, when an SoC of the first battery is lower than a preset reference, when it is impossible to communicate with the first controller or the low voltage DC-DC converter for dropping the voltage of the first battery and applying the dropped voltage to the second battery, or when the low voltage DC-DC converter malfunctions, the second controller is configured not to monitor the states of the main battery and the secondary battery.

6. The battery management system of claim 1, wherein, after woken up, the second controller is configured to check whether the main relay connected to the first battery short circuits, and to initiate the preset time calculated based on the count value provided by the RTC in advance when a state in which the main relay short circuits is changed to the power-off state.

7. The battery management system of claim 1, wherein, when charging of the second battery is terminated, the second controller is configured to turn off the main relay and to continuously maintain the preset time that is calculated based on the count value provided by the RTC in advance rather than resetting the preset time.

8. The battery management system of claim 1, wherein the preset time is determined based on an analysis result of a vehicle customer relation management (VCRM) system for collecting and analyzing information on driving of the vehicle or a preset limit on a state of charge (SoC) of the second battery consumed by dark current after the vehicle stops traveling.

9. A battery management method of a vehicle, the method comprising:
when an external input of stopping driving of the vehicle is generated, controlling a plurality of controllers in the vehicle in a power-off state, by a first controller;
executing a power latch mode and turning off a main relay connected to a first battery for storing energy for generating power of the vehicle, by a second controller; and
terminating the power latch mode, being woken up by directly receiving power from the secondary battery in every preset time period during a preset time calculated based on a count value provided from a real time clock (RTC) installed in the second controller, and monitoring states of the main battery and the secondary battery, by the second controller,
wherein the monitoring includes: when a state of charge (SoC) of the second battery is equal to or less than a preset reference value as a monitoring result of the states of the main battery and the secondary battery, after woken up, turning on the main relay connected to the first battery and operating a low voltage DC-DC converter, for dropping a voltage of the first battery and applying the dropped voltage to the second battery, to charge the second battery by dropping the voltage of the first battery and applying the dropped voltage to the second battery, by the second controller.

10. The method of claim 9, further comprising:
after turning off the main relay, checking a condition in which the states of the main battery and the secondary battery are not monitored, and non-monitoring the states of the main battery and the secondary battery when the condition is satisfied.

11. The method of claim 10, wherein the non-monitoring includes non-monitoring the states of the main battery and the secondary battery by the second controller, as the condition, when it is impossible to check the SoC of the second battery for supplying a power voltage of the first controller and the second controller, when an SoC of the first battery is lower than a preset reference, when it is impossible to communicate with the first controller or the low voltage DC-DC converter for dropping the voltage of the first battery and applying the dropped voltage to the second battery, or when the low voltage DC-DC converter malfunctions.

12. The method of claim 9, wherein the monitoring includes:
after woken up, checking whether the main relay connected to the first battery short circuits, by the second controller; and
initiating a preset time that is calculated based on a count value provided by the RTC in advance when a state in which the main relay short circuits is changed to the power-off state, by the second controller.

13. The method of claim 9, wherein the monitoring includes, when charging of the second battery is terminated, turning off the main relay and continuously maintaining the preset time that is calculated based on the count value provided by the RTC in advance rather than resetting the preset time.

14. A battery management system of a vehicle including a main battery for storing driving power of the vehicle and a secondary battery having a lower voltage output than the main battery and for storing electric power for a plurality of controllers in the vehicle, the battery management system comprising:
a first controller configured to control a power-on (IG ON) state and a power-off (IG OFF) state of the plurality of controllers; and
a second controller including a real time clock (RTC), and configured to be woken up by directly receiving power from the secondary battery in every preset time period during a preset time calculated based on a count value provided from the RTC when the power-off state is started by the first controller and to monitor states of the main battery and the secondary battery,
wherein the second controller is configured to operate in a power latch mode that is executed by directly receiving power from the secondary battery during a preset reference time when the power-off state is started by the first controller, and to be woken up in every preset time period after the power latch mode is terminated.

* * * * *